United States Patent [19]

Scovell

[11] Patent Number: 4,490,182
[45] Date of Patent: Dec. 25, 1984

[54] SEMICONDUCTOR PROCESSING TECHNIQUE FOR OXYGEN DOPING OF SILICON

[75] Inventor: Peter D. Scovell, Chelmsford, England

[73] Assignee: ITT Industries, Inc., New York, N.Y.

[21] Appl. No.: 301,794

[22] Filed: Sep. 14, 1981

[30] Foreign Application Priority Data

Oct. 7, 1980 [GB] United Kingdom ............... 8032246

[51] Int. Cl.³ .......................................... H01L 21/265
[52] U.S. Cl. ..................................... 148/1.5; 29/576 B
[58] Field of Search ..................... 29/576 B; 148/1.5; 357/51; 427/85, 93, 94

[56] References Cited

U.S. PATENT DOCUMENTS

| | | | |
|---|---|---|---|
| 3,622,382 | 11/1971 | Brack | 148/1.5 |
| 3,830,668 | 8/1974 | Dearnaley et al. | 148/1.5 |
| 3,976,511 | 8/1976 | Johnson | 148/1.5 |
| 4,406,051 | 9/1983 | Iizuka | 29/576 B |

Primary Examiner—Brian E. Hearn
Assistant Examiner—Hunter L. Auyang
Attorney, Agent, or Firm—James B. Raden

[57] ABSTRACT

A process for isolating a semiconductor device formed in a p-type silicon substrate includes implanting a layer of oxygen ions below the device. The substrate is then heated to 430°-470° C. to activate the silicon/oxygen complexes thus formed and compensate or overcompensate the region thus forming an intrinsic or n-type isolating layer. The technique may be employed for the isolation of DMOS structures.

10 Claims, 2 Drawing Figures

SEMICONDUCTOR PROCESSING TECHNIQUE FOR OXYGEN DOPING OF SILICON

BACKGROUND OF THE INVENTION

The present invention relates to semiconductor processing techniques, and in particular to techniques for oxygen doping of silicon.

One of the problems involved in any integrated circuit manufacturing technique is that of insulating or conductively isolating some or all of the various semiconductor devices from the substrate. Present techniques for isolating devices from the substrate include diffusion isolation, where the isolation is achieved by reverse biasing beneath and often forming part of the device, and also dielectric isolation where a dielectric isolating layer isolates the device. While such techniques provide effective isolation, they are time consuming and thus add to the processing costs of the device.

A recently developed insulation technique utilizes an ion implantation technique in which a layer of the semiconductor substrate is heavily implanted with oxygen. The substrate is then heated to a high temperature to form an insulating layer of silica. This process involves a lengthy implantation and, because of the high degree of crystal damage, a long annealing time at a relatively high temperature.

SUMMARY OF THE INVENTION

Accordingly, it is a general object of the present invention to overcome the disadvantages of the prior art.

More particularly, it is an object of the invention to provide a method of forming a conductively isolating region in a p-type silicon substrate.

It is another object of the invention to provide a method forming an intrinsic or n-type conductivity region in a p-type silicon substrate which is relatively inexpensive and which achieves excellent results nevertheless.

A concomitant object of the invention is to provide a semiconductor structure having an improved isolating layer or region therein.

In pursuance of those objects and others which will become apparent hereafter, one feature of the present invention resides in a method of forming an isolating region in a p-type doped silicon substrate, especially for isolating at least one semiconductor device from the remainder of the substrate. The method comprises the steps of implanting oxygen ions into the desired region until the concentration level thereof in the desired region substantially corresponds to the p-type doping level of the substrate material; and heating the substrate to a temperature sufficient to activate the oxygen ions into a state in which they at least compensate for the effect of the p-type doping impurities in the desired region to convert the latter into an isolating region of silicon in the intrinsic to n-type conductivity range.

According to another aspect of the invention there is provided a semiconductor structure, comprising a p-type silicon substrate having an active surface with at least one semiconductor device disposed at the active surface of the substrate, and an oxygen-containing isolating layer of silicon of the intrinsic to n-type conductivity range positioned between the semiconductor device and the remainder of the substrate.

Oxygen rich silicon exhibits strong donor activation when heated, e.g. to a temperature between 430° and 470° C. The nature of this effect is not fully understood, but it is thought that the formation of $SiO_4$ complexes plays some part in the process. Heating to lower temperatures results in no formation of the complexes and thus no donor production, while heating to higher temperatures also results in no donor production.

P-type silicon, which is oxygen rich, can undergo a conductivity type reversal to n-type if the heating is continued for an extended period. Prior to the conductivity type reversal, intrinsic silicon is formed as the oxygen complex donors compensate for the acceptors present in the originally p-type material, thus results in an increase of the resistivity of the semiconductor.

BRIEF DESCRIPTION OF THE DRAWINGS

The aforementioned features and objects of this invention will become more apparent by reference to the following description taken in conjunction with the accompanying drawings, in which.

DETAILED DESCRIPTION OF THE PREFERRED EMBODIMENTS

Figure 1:
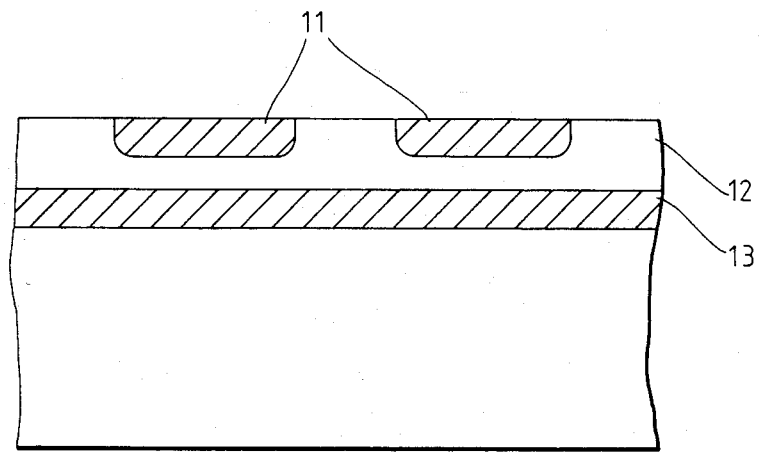
FIG. 1 is a cross-sectional view of a semiconductor device formed in a silicon substrate and insulated therefrom by a high resistivity layer.

Referring to FIG. 1, a semiconductor device 11, for example a bipolar or an MOS transistor, is formed at an active surface of a silicon substrate. Prior to the formation of the smiconductor device, an oxygen rich layer 13 is formed in the substrate by a light implantation of oxygen ions. Typically the layer 13 is implanted to an oxygen level of $10^{18}$ cm$^{-3}$. The device 11 is then formed in the wafer surface by standard techniques, followed by the heating of the substrate to 430° C. to 470° C., and preferably to 450° C., to activate the silicon/oxygen complexes and thereby compensating or overcompensating for the effect of the p-type doping impurities present in the original p-type silicon, thus forming a high resistivity intrinsic or n-type region in the layer 13 and isolating the device 11 from the substrate 12.

The technique can be employed with MOS or bipolar processing when conductive isolation of semiconductor devices from the substrate is required. The oxygen-free p-type silicon wafer is implanted with oxygen to a depth exceeding the deepest semiconductor device structure. The semiconductor device structures are subsequently formed in the conventional way after which, but prior to device metallization, the wafer is heated to 430°–470° C. in an inert atmosphere to activate the isolating layer. Finally, the wafer is metallized, diced and packaged to form the finished semiconductor devices.

The techniques described herein are particularly suitable for the manufacture of DMOS (double diffused MOS) structures, inasmuch as such structures require a lightly doped n-region on a p-type substrate. Conventionally, such a structure is realized by growing epitaxial layers on the substrate at high temperatures. However, the use of such high temperatures involves the associated problems of wafer distortion and of layer thickness control. The present technique, by its use of relatively low temperatures, substantially overcomes these problems.

For example, if oxygen is implanted into a p-type float zone substrate (oxygen-free) followed by annealing, the oxygen donor production type reverses the conductivity type of the semiconductor surface by forming an n-type layer. The resistivity of this layer can be controlled by corresponding adjustment of the annealing period. Furthermore, if the oxygen ions are implanted through a mask into the proposed active region, then lateral isolation is accomplished at the same time. This obviates the need for the conventional diffusion/drive-in processes.

Figure 2:
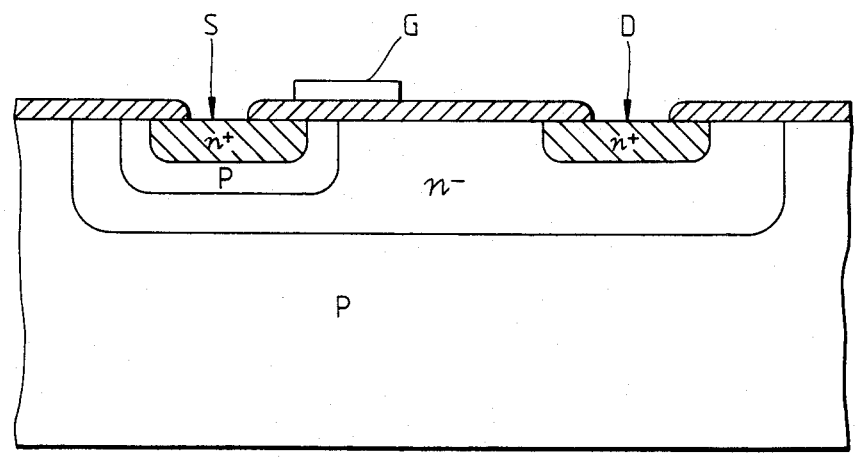
FIG. 2 is a cross-sectional view of a DMOS structure insulated via an implanted oxygen layer.

FIG. 2 shows a typical DMOS structure which can be produced using the oxygen ion implantation techniques described herein. The device is formed in an oxygen-free p-type substrate. As can be seen, the device has the usual source (S), gate (G), and drain (D) regions and is conductively isolated from the substrate by an n-type region, typically 1 μm deep, formed by oxygen ion implantation followed by annealing at a temperature of 430°–470° C. to activate the oxygen donor centers. Typically, such a layer can be provided by implanting doubly charged oxygen ions at a beam intensity of $5 \times 10^{13}$ cm$^{-2}$ and at an energy of 200 keV, so as to provide a peak oxygen concentration of $10^{18}$ cm$^{-3}$ to a depth of 1 μm followed by annealing at 450° C. for 1,000 minutes. The choice of oxygen ion energy and concentration are dependent on the desired n-layer doping level and the annealing time is chosen to provide the optimum donor concentration.

The techniques described herein are evidently not limited to the production of discrete devices, but can be applied advantageously to the manufacture of integrated circuits.

While I have described above the principles of my invention in connection with specific apparatus, it is to be clearly understood that this description is made only by way of example and not as a limitation to the scope of my invention as set forth in the accompanying claims.

I claim:

1. A method of forming a conductively isolating intrinsic or n-type region in a p-type doped silicon substrate comprising the steps of:
    implanting a layer of oxygen ions into a desired region of said substrate at a concentration level substantially corresponding to the doping level of the substrate material; and
    heating said substrate to a temperature in the range of about 430° C. to about 470° C. for a period of time sufficient to convert said layer into an isolating region having an intrinsic to n-type conductivity level.

2. The method of claim 1 including the step of masking selected areas of the substrate at least during a part of said implanting step.

3. The method of claim 1 wherein said substrate is substantially oxygen-free prior to said implanting step.

4. The method of claim 1, wherein said implanting step includes bombarding the substrate with the oxygen ions at an energy of 200 keV to provide a peak oxygen ion concentration of $10^{18}$ cm$^{-3}$ to a depth of 1 μm.

5. A method of forming a semiconductor structure comprising the steps of:
    implanting a layer of oxygen ions into a p-type doped silicon substrate at a concentration level substantially corresponding to the doping level of said substrate;
    forming at least one semiconductor device in said substrate; and
    thereafter, heating said substrate at a temperature in the range of about 430° C. to about 470° C. to activate the oxygen in said oxygen layer and to at least compensate for the effect of the p-type impurity in said layer whereby said layer is converted to an intrinsic or n-type conductivity region to isolate said at least one semiconductor device.

6. The method of claim 5 including the step of masking selected areas of the substrate at least during a part of said implanting step.

7. The method of claim 5 wherein said substrate is substantially oxygen-free prior to said implanting step.

8. The method of claim 5 wherein said implanting step includes bombarding the substrate with oxygen ions at an energy of 200 keV to provide a peak oxygen ion concentration of $10^{18}$ cm$^{-3}$ to a depth of 1 micron.

9. The method of claim 5 wherein said at least one semiconductor device has a DMOS configuration.

10. The method of claim 5 wherein said at least one semiconductor device is a bipolar or MOS transistor.

* * * * *